(12) United States Patent
Lowther

(10) Patent No.: US 6,905,889 B2
(45) Date of Patent: Jun. 14, 2005

(54) INDUCTOR DEVICE WITH PATTERNED GROUND SHIELD AND RIBBING

(75) Inventor: Rex Everett Lowther, Palm Bay, FL (US)

(73) Assignee: Globespan Virata Inc., Red Bank, NJ (US)

(*) Notice: Subject to any disclaimer, the term of this patent is extended or adjusted under 35 U.S.C. 154(b) by 0 days.

(21) Appl. No.: 10/740,548

(22) Filed: Dec. 22, 2003

(65) Prior Publication Data

US 2004/0183156 A1 Sep. 23, 2004

Related U.S. Application Data

(62) Division of application No. 10/194,496, filed on Jul. 11, 2002, now Pat. No. 6,756,656.

(51) Int. Cl.⁷ ................... H01L 21/00; H01L 21/8234
(52) U.S. Cl. .................. 438/3; 438/238; 438/655
(58) Field of Search ................. 438/3, 238, 652, 438/655, 669

(56) References Cited

U.S. PATENT DOCUMENTS

| | | | | |
|---|---|---|---|---|
| 5,717,243 A | * | 2/1998 | Lowther | .................. 257/531 |
| 6,437,409 B2 | | 8/2002 | Fujii | |
| 6,486,529 B2 | * | 11/2002 | Chi et al. | .................. 257/531 |
| 6,593,838 B2 | | 7/2003 | Yue | |
| 6,635,949 B2 | * | 10/2003 | Lowther et al. | ............. 257/531 |
| 6,815,220 B2 | * | 11/2004 | Crawford et al. | .............. 438/3 |
| 2002/0093414 A1 | * | 7/2002 | Wong et al. | ................ 336/200 |

OTHER PUBLICATIONS

"Handbook of Semiconductor Silicon Technology," eds. William C. O'Mara, Robert B. Herring, and Lee P. Hunt, Noyes Publications., Norwich, New York, (reprint edition 1990), pp. 700–702.
"Semiconductor Materials and Process Technology Handbook for Very Large Scale Integration (VLSI) and Ultra Large Scale Integration (ULSI)," ed. Gary E. McGuire, Noyes Publications, Norwich, New York, (1988) p. 439.

* cited by examiner

Primary Examiner—T. N. Quach
(74) Attorney, Agent, or Firm—Hunton & Williams

(57) ABSTRACT

Inducting devices having a patterned ground shield with ribbing in an integrated circuit. In one embodiment, an inducting device comprises conductive turns to conduct current, a shield layer and a plurality of ribs. The shield layer is formed a select distance from the conductive turns. The shield layer is patterned into sections of shield to prevent eddy currents. The plurality of ribs are formed from a conductive layer that is positioned between the conductive turns and shield layer. Each rib is electrically coupled to a single associated section of shield. Moreover, each rib is more conductive than its associated section of shield to provide a less resistive current path than its associated section of shield.

13 Claims, 10 Drawing Sheets

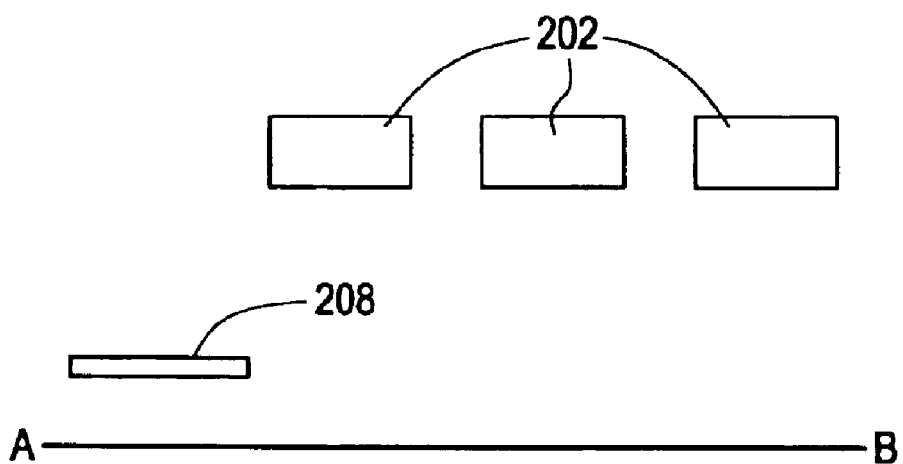
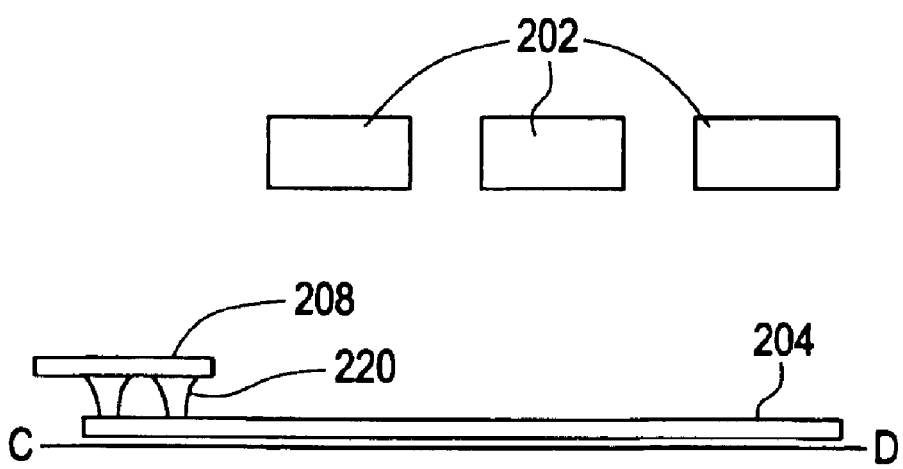

INDUCTOR DEVICE WITH PATTERNED GROUND SHIELD AND RIBBING

CROSS-REFERENCE TO RELATED APPLICATION

This application is a divisional of U.S. application Ser. No. 10/194,496, filed Jul. 11, 2002, now U.S. Pat. 6,756,656 "INDUCTOR DEVICE WITH PATTERNED GROUND SHIELD AND RIBBING", the contents of which are incorporated herein by reference in their entirety.

TECHNICAL FIELD

The present invention relates generally to inducting devices incorporated in integrated circuits and in particular the present invention relates to inducting devices having a patterned ground shield with ribbing in an integrated circuit.

BACKGROUND

Integrated circuits incorporate complex electrical components formed in semiconductor material into a single circuit. Generally, an integrated circuit comprises a substrate upon which a variety of circuit components are formed. Integrated circuits are made in and/or on semiconductor material. Conduction in semiconductor material takes place by means of hole and electron flow. The resistance of semiconductor material can vary by many orders-of-magnitude depending on the concentration of impurities or dopants. Semiconductor material is used to make electrical devices that exploit its unique properties.

An inducting device is an electrical component that can be formed in an integrated circuit. Examples of inducting devices are simple inductors, symmetric inductors with or without center taps, transformers, baluns and the like. An inducting device has one or more conductive paths (or conductive turns) formed in a spiral or loop shape. In particular, the conductive turns are typically formed in a circular or polygonal shape. Moreover, the conductive turns may be formed in a single layer or in multiple layers. The conventional measure of an inductor's performance in an integrated circuit is called the Quality Factor or "Q." Q is defined herein as generally the ratio of the maximum magnetic energy stored in the inductor divided by the energy dissipated by the inductor on each cycle. Two types of parasitics degrade Q in inductor devices formed in integrated circuits. They are parasitic capacitances and parasitic resistances. Accordingly, it is desired to reduce the parasitic capacitances and resistances to obtain a high Q spiral inductor. One method of reducing parasitic resistance is by introducing a patterned ground shield. In particular, if the semiconductor material is highly resistive it is not considered a lossy medium and a shield layer is not needed. However, a common semiconductor substrate is doped to have a resistance around 10–20 ohm-cm. A semiconductor substrate doped at this level tends to be very lossy. The use of a patterned ground shield in an inducting device having a substrate of this resistance reduces this loss. An example of a patterned ground shield is disclosed in the commonly assigned U.S. Pat. No. 5,717,243, which is herein incorporated by reference. Another example of an inductor with patterned ground shield that has both a reduced parasitic capacitance and a parasitic resistance is found in the commonly assigned U.S. patent application Ser. No. 10/039,200, now U.S. Pat. No. 6,635,949, which is also herein incorporated by reference. It is further desired to reduce parasitic resistance to improve the Q in an inductor device.

For the reasons stated above and for other reasons stated below which will become apparent to those skilled in the art upon reading and understanding the present specification, there is a need in the art for inducting devices with reduced parasitic resistance.

SUMMARY

The above-mentioned problems with spiral inductors in integrated circuits and other problems are addressed by the present invention and will be understood by reading and studying the following specification.

In one embodiment, a shield region for an inducting device in an integrated circuit is disclosed. The shield region comprises a plurality of conductive shield sections, one or more shield taps and one or more conductive ribs for each shield section. Each shield tap is electrically coupled to associated shield sections to provide a current path for shield current in the shield sections. The one or more conductive ribs for each shield section provide a less resistive path to the one or more shield taps. Each conductive rib is electrically coupled to its associated shield section and associated shield tap. Moreover, each conductive rib is more conductive than its associated shield section. The one or more conductive ribs are formed from a conductive layer that is located between the shield sections and conductive turns of the inducting device. In addition, each conductive rib has a relatively thin lateral width with respect to a lateral width of its associated shield section.

In another embodiment, an inducting device for an integrated circuit is disclosed. The inducting device comprises conductive turns to conduct current, a shield layer and a plurality of ribs. The shield layer is formed a select distance from the conductive turns. The shield layer is patterned into sections of shield to prevent eddy currents. The plurality of ribs are formed from a conductive layer that is positioned between the conductive turns and shield layer. Each rib is electrically coupled to a single associated section of shield. Moreover, each rib is more conductive than its associated section of shield to provide a less resistive current path than its associated section of shield.

In another embodiment, a method of forming conductive ribs in an inductive device having patterned shield sections is disclosed. The method comprises forming contacts to the patterned shield sections. Depositing a metal layer overlaying the contacts and patterning the metal layer into ribs, wherein each rib is electrically coupled to an associated shield section via associated contacts.

In yet another embodiment, a method of forming conductive ribs in an inductive device having patterned shield sections is disclosed. The method comprises siliciding a conductive layer overlaying the patterned shield sections and patterning the silicided conductive layer into ribs. Each rib is formed to have a lateral width that is relatively thin with respect to an associated shield segment. Moreover, each rib is further electrically coupled to its associated shield section to provide a less resistive current path for shield current in the associated shield section.

In further another embodiment, a method of forming an inducting device is disclosed. The method comprises forming a conductive shield layer. Patterning the shield layer into shield sections. Forming a conductive rib layer, wherein the conductive rib layer is more conductive than the conductive shield layer. Patterning the conductive rib layer into a plurality of ribs, wherein each rib is electrically coupled to an associated shield section and forming conductive turns, wherein the ribs are positioned between the shield sections and the conductive turns.

BRIEF DESCRIPTION OF THE DRAWINGS

The present invention can be more easily understood and further advantages and uses thereof more readily apparent, when considered in view of the description of the preferred embodiments and the following figures in which:

FIG. 2A is a cross-sectional view along line AB of the spiral inductor of FIG. 2 of the present invention;

FIG. 2B is a cross-sectional view along line CD of the spiral inductor of FIG. 2 of the present invention;

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention use conductive ribs that are coupled to a shield section and positioned between the conductive turns and the shield layer to provide a less resistive path for shield current. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "right", "left", "higher", "lower", "over," "top", "below" and "under" are defined with respect to the conventional plane or working surface being on the top surface of the wafer or substrate, regardless of the orientation of the wafer or substrate. Before a detailed discussion of the embodiments of the present invention is described, further background is first provided to aid in the understanding of the embodiments of the present invention.

Figure 1A:
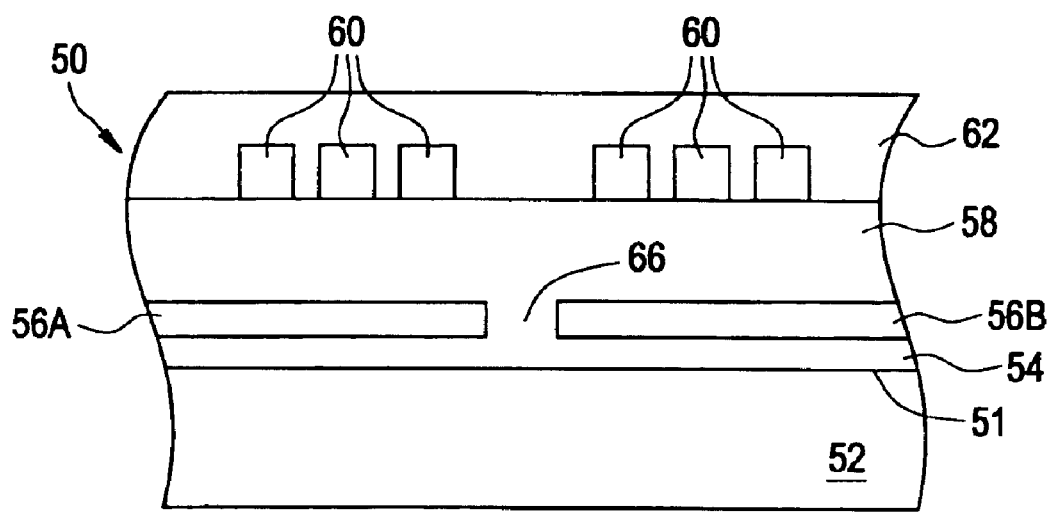
FIG. 1A is a cross-sectional view of a portion of a spiral inductor formed in an integrated circuit of the prior art.

Referring to FIG. 1A, a cross-sectional view of an inducting device 50 in an integrated circuit of the prior art is disclosed. The inducting device includes substrate 52, shield sections 56A and 56B and conductive turns 60. In addition, dielectric layer 54 is formed between the substrate 52 and shield sections 56A and 56B. Moreover, dielectric layer 58 is formed between the shield sections 56A and 56B and the conductive turns 60. FIG. 1A also illustrates protective dielectric layer 62 and the working surface 51 of the substrate 52. Gap 66 between the shield sections 56A and 56B is used to prevent eddy (or image) currents in the shield 56 caused by inductive coupling to the conducting turns 60. Moreover, gaps (including gap 66) form patterned shield sections (including shield sections 56A and 56B) from a shield layer that is more conductive than adjacent regions (dielectric layer 54 and dielectric layer 58). In embodiments of the prior art, the gaps 66 are filled with a dielectric. In further other embodiments of the prior art the gaps 66 are trenches or junctions. In addition, in some embodiments of the prior art, the conductive turns 60 (or spirals) are made from a continuous metal strip having one or more turns. As previously mentioned, the conductive turns 60 may be in any polygonal or circular spiral or loop shape.

Figure 1B:
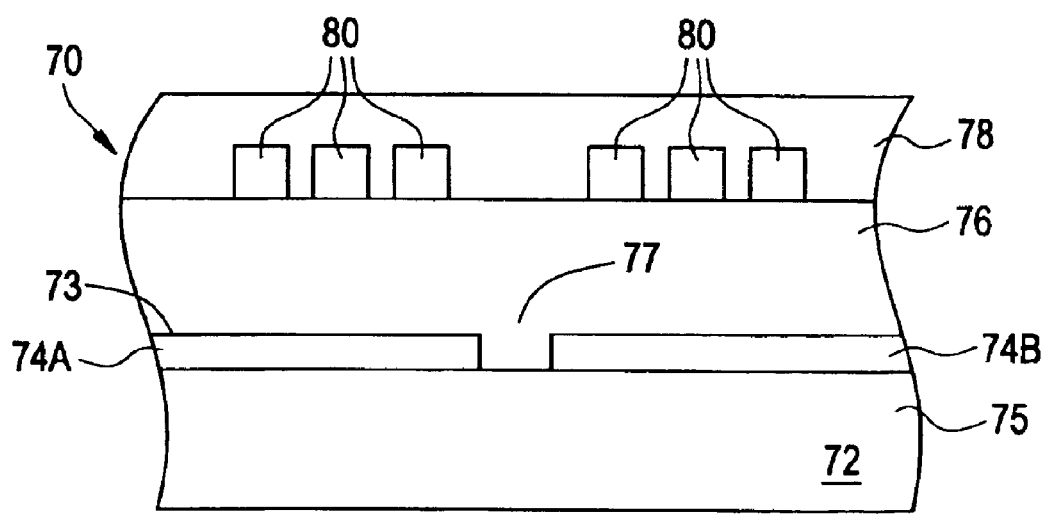
FIG. 1B is a cross-sectional view of a portion of another spiral inductor formed in an integrated circuit of the prior art.

Referring to FIG. 1B, another example of an inducting device 70 of the prior art is illustrated. This prior art embodiment includes substrate 72, shield sections 74A and 74B, conductive turns 80, dielectric layer 76 and protective dielectric layer 78. In this embodiment, the shield sections 74A and 74B are formed from a doped and or silicided shield layer that is in turn formed in and or on the substrate adjacent a working surface 73 of the substrate 72. In particular, gaps formed in the shield layer (which include gap 77) form patterned shield sections (which include shield sections 74A and 74B). As with the other embodiments of the prior art, shield sections 74A and 74B are more conductive than the adjacent regions (substrate 72 and dielectric layer 76 in this prior art embodiment). The position of the respective shield layer which the shield sections 74A and 74B are formed from can generally be described as being located between the conductive turns 80 and a non-device layer region 75 of the semiconductor substrate. As illustrated in FIG. 1B, the non-device layer region 75 is below shield sections 74A and 74B.

Figure 1C:
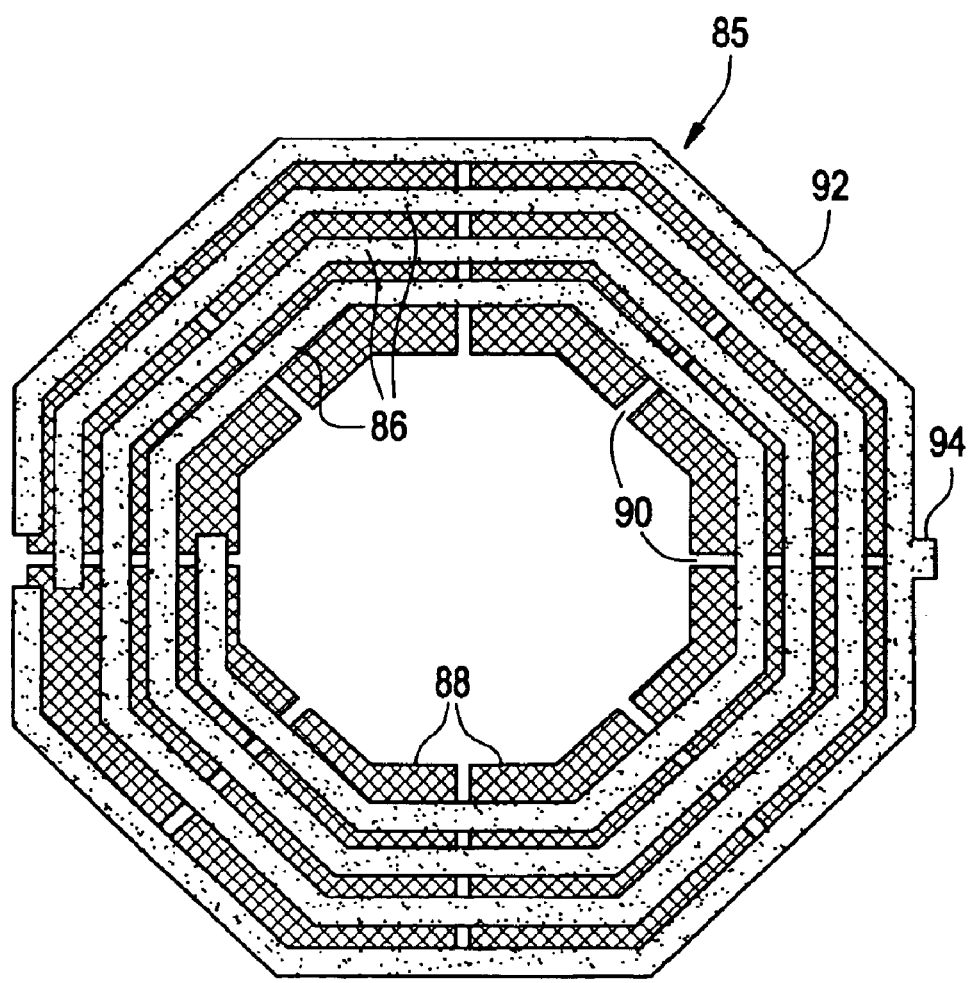
FIG. 1C is a plan view of an inducting device of the prior art.

A plan view of another inducting device 85 of the prior art is illustrated in FIG. 1C. The inducting device 85 of FIG. 1C includes turns 86, shield sections 88 and gaps 90. Also illustrated is shield tap 92 and shield tap terminal 94. The shield tap 92 is at least as conductive as the shield layer and is coupled to each patterned shield section 88 to provide an electrical path to the shield tap terminal 94. The shield tap terminal 94 further provides a current path away from the inducting device 85. The electric path is typically to an AC ground.

Figure 2:
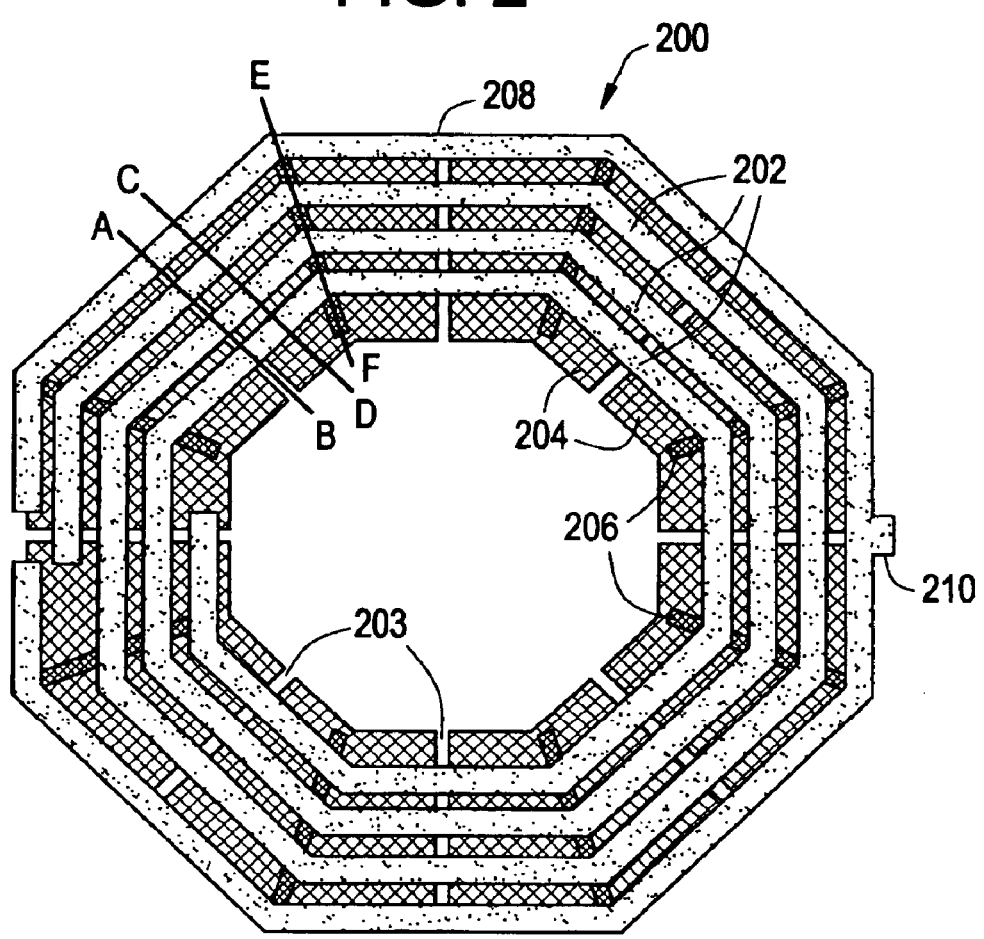
FIG. 2 is a plan view of a spiral inductor of one embodiment of the present invention.
Figure 2C:
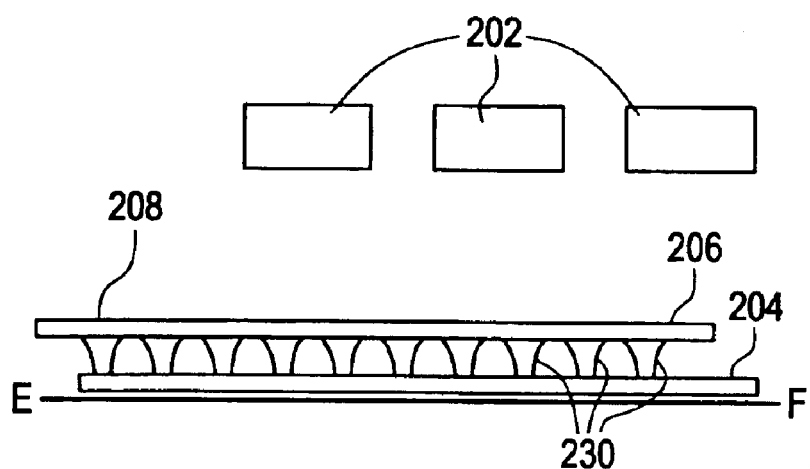
FIG. 2C is a cross-sectional view along line EF of the spiral inductor of FIG. 2 of the present invention.

As stated above, embodiments of the present invention provide conductive strips or ribs that are coupled to a shield section and positioned in a layer level that is between the conductive turns and the shield layer to provide a less resistive path for shield current. A plan view of one embodiment of an inducting device 200 of the present invention is illustrated in FIG. 2. As illustrated, the inducting device 200 includes conductive turns 202, patterned shield sections 204, gaps 203 and shield tap 208. Shield tap 208 is coupled to shield tap terminal 210. Shield tap terminal 210 is typically coupled to AC ground but may be coupled to other locations depending on the requirements of a circuit the inducting device 200 is associated with. The present invention includes ribs 206. Each rib 206 is coupled to an associated section of shield 204 and to shield tap 208. The location of the various elements of the inducting device in vertical relation to each other is illustrated in FIGS. 2A through 2C.

Referring to FIG. 2A, a cross-sectional view along line AB of FIG. 2 is illustrated. In particular, the conductive turns 202 and shield tap 208 are illustrated in FIG. 2A. In between the conductive turns 202 and shield tap 208 is dielectric material. In FIG. 2B, a cross-sectional view along line CD of FIG. 2 is illustrated. Besides the conductive turns 202 and the shield tap 208, this view also illustrates a section of shield 204 and contacts 220. Contacts 220 electrically couple the shield tap 208 to the section of shield 204. In FIG. 2C, a cross-sectional view along line EF of FIG. 2 is illustrated. FIG. 2C illustrates the conductive turns 202 and a section of shield 204. FIG. 2C further illustrates rib 206. Rib 206 is electrically coupled to shield section 204 via contacts 230.

The shield sections 204 are conductive. In the embodiment of FIG. 2, each shield section 204 conducts shield current primarily radially from below the conductive turns 202 to shield tap 208. As illustrated, the shield tap 208 is an incomplete conductive ring. That is, a conductive ring that has at least one gap to prevent countercurrent. By providing an alternative low-resistance path to a shield terminal 210 and then typically to ground, the shield sections 240 and shield tap 208 significantly reduce losses caused by capacitively induced current through the semiconductor substrate.

The plurality of conducting ribs 206 or (conducting strips 206) are used to lower the parasitic resistance. The ribs 206 are made from a material that is more conductive than the patterned shield sections 204. Each rib 206 is made from a layer of conductive material that is positioned between the conductive turns 202 and an associated section of shield 204. Moreover, each rib 206 is electrically coupled to an associated section of shield 204. That is, each rib 206 is only coupled to its associated shield section 204. Each rib 206 is further coupled to the shield tap 208. In the embodiment illustrated in FIG. 2, the shield tap 208 extends around and is coupled to an outer perimeter of the ribs 206. The ribs 206 greatly reduce the overall shield resistance by giving the shield current in each associated section of shield 204 a less resistive path to the shield tap 208. Although, the addition of the ribbing 206 closer to the conductive turns 208 will introduce additional capacitance from the metal spiral layer to the shield structure (shield sections 204, ribs 206, and shield taps 208), this additional capacitance can be minimized by making each rib 206 relatively thin with respect to its associated shield section 204. That is, each rib 206 is patterned or formed to have less of a lateral width than a lateral width of its associated shield section 204. Further stated another way, the additional capacitance is reduced by forming each rib 206 to take up less lateral area than its associated shield section 204.

Typically, the shield layer has many times the resistivity of metal. Shields of this resistivity have been very useful with overall shield resistances on the order of 1 ohm. Simulations varying the shield resistance show that Q can be improved by a further reduction in resistance. In fact, the shield resistance can be reduced by a factor of 3 or more with the addition of the ribs 206 of the present invention.

Figure 3A:
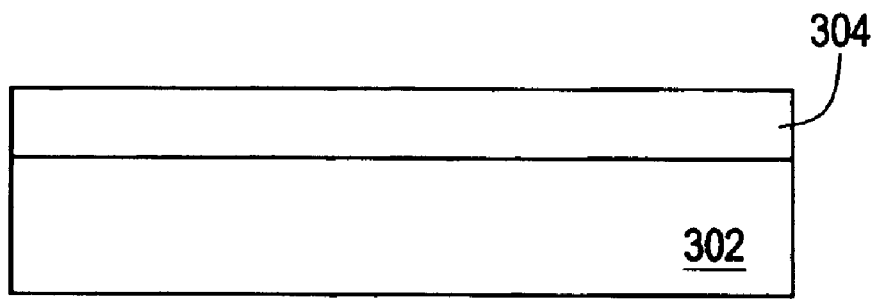
FIGS. 3A through 3E are cross-sectional views illustrating the formation of one embodiment of the present invention.
Figure 3B:
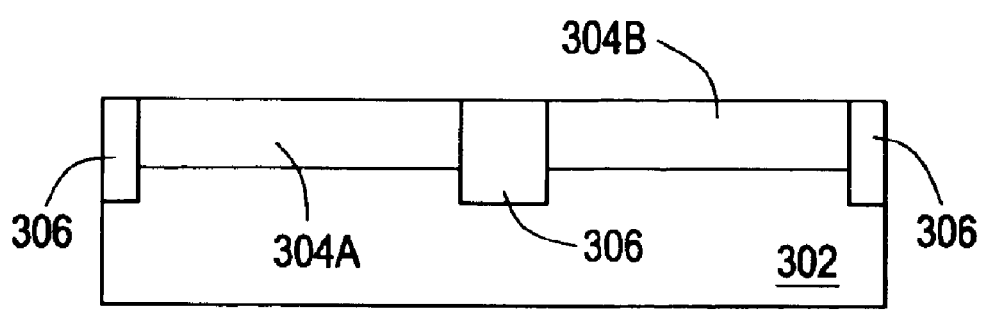

In one embodiment of the present invention, the ribs are formed from a layer that is separated from the shield layer by a layer of dielectric. In this embodiment, contacts are formed through the dielectric layer to provide electrical current paths between the ribs and the shield. Referring to FIGS. 3A through 3F partial cross-sectional views illustrating methods of forming ribs of the present invention of this embodiment is illustrated. In FIG. 3A, a shield layer 304 is formed over a lossy substrate 302. In one embodiment, the shield layer 304 is formed by a silicide process. In another embodiment, the shield layer 304 is formed by implantation and yet in another embodiment the shield layer 304 is formed by diffusion. Although, there are many methods of forming the shield layer, one trait the shield layer 302 must have, in this embodiment, is that it is more conductive than material it is directly adjacent to, which in this case is the lossy substrate 302. The shield layer 304 is then patterned into sections of shield by gaps 306 or trenches 306 as illustrated in FIG. 3B. In particular, shield sections 304A and 304B are shown in FIG. 3B. In one embodiment, the trenches 306 are formed by first removing material (portions of shield layer 304 and substrate 302) to form holes where the trenches 306 are to be positioned by some type of etch or similar technique. A thin coating film of oxide is then formed in the holes. The holes are then filled with silicon to form the trenches 306.

Figure 3C:
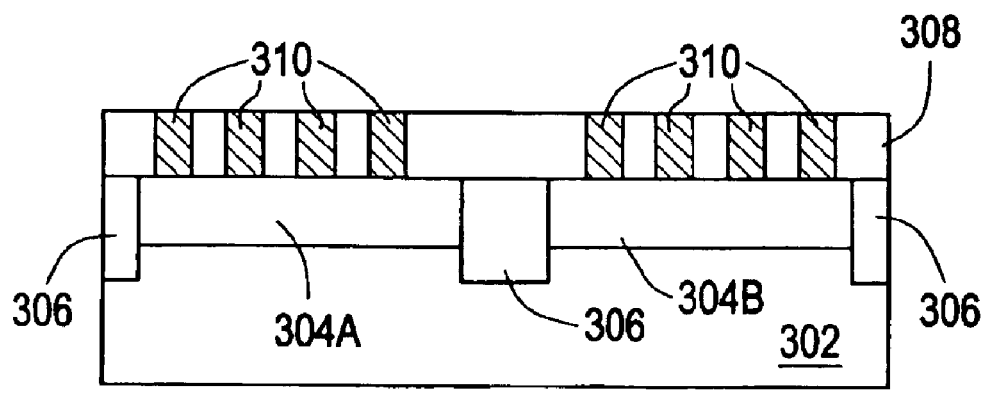
Figure 3D:
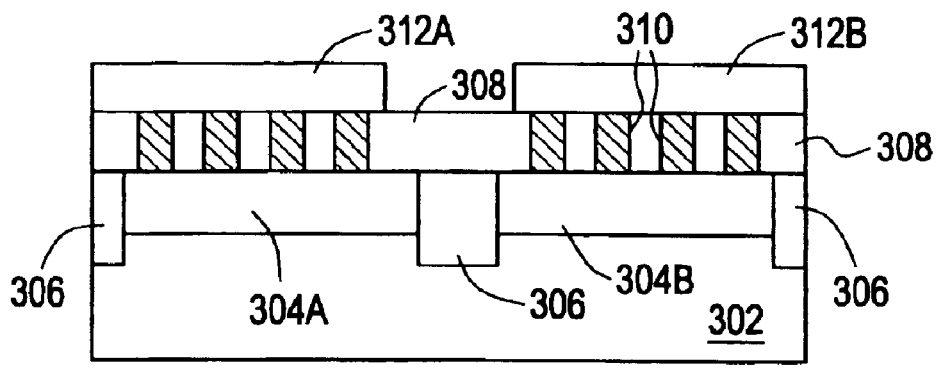

A dielectric layer 308 is then formed overlaying the shield sections 304A and 304B as illustrated in FIG. 3B. Contacts 310 are formed though dielectric layer 308. In one embodiment, portions of dielectric layer 308 are removed where the contacts 310 are to be positioned and then filled with a conductive material. In other embodiments the holes where the contacts 310 are to be formed are filled with conductive material when a subsequent conductive layer is formed overlaying the dielectric layer 308. Referring to FIG. 3C, the ribs are then formed overlaying dielectric layer 308. In particular, FIG. 3C illustrates ribs 312A and 312B. In one embodiment, ribs 312A and 312B are formed by patterning one or more metal layers. In another embodiment, ribs 312A and 312B are formed in a conductive layer that is more conductive than the shield sections 304A and 304B. Contacts 310 electrically couple each rib to an associated shield section 304A or 304B. For example, in FIG. 4C, rib 312A is electrically coupled to shield section 304A and rib 312B is electrically coupled to shield section 304B.

Figure 3E:
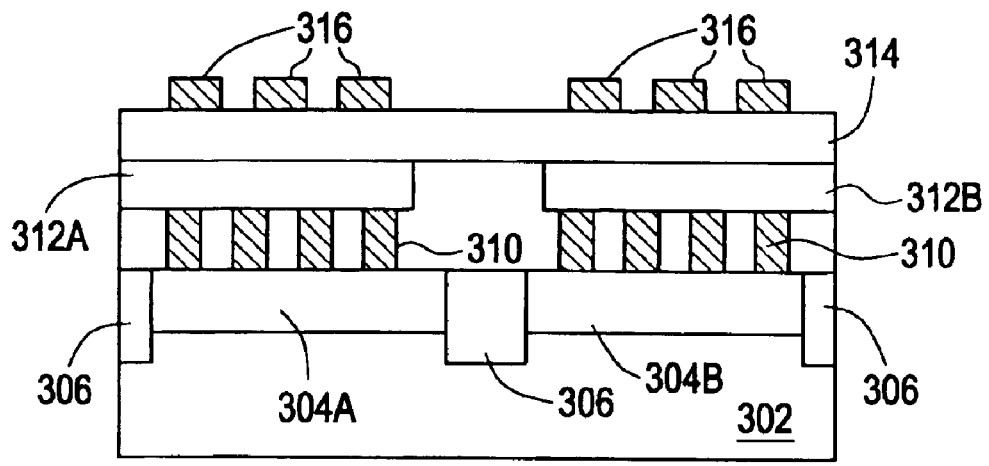
Figure 3F:
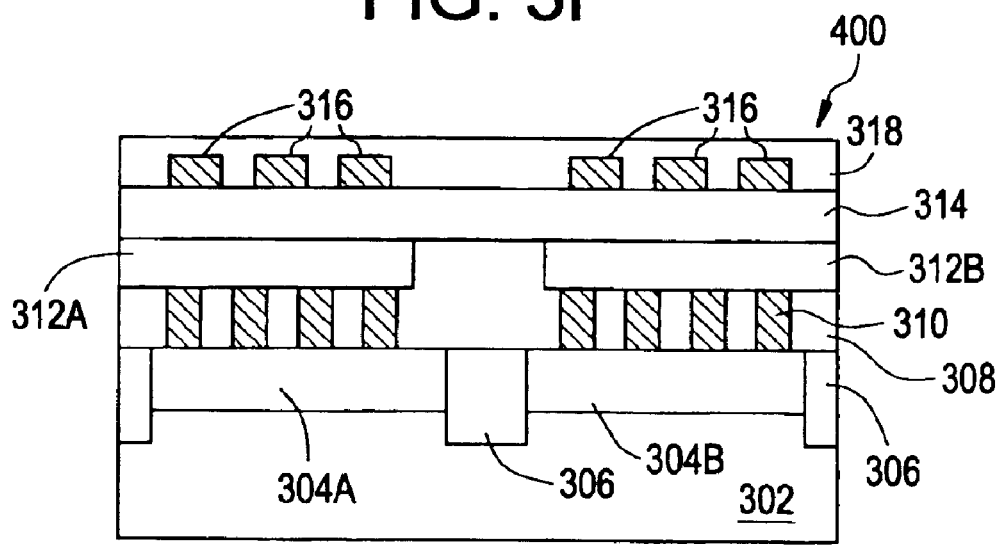
FIG. 3F is a partial cross-sectional view of a spiral inductor of one embodiment of the present invention.

Dielectric layer 314 is then formed over ribs 312A and 312B as illustrated in FIG. 3E. The conductive turns 316 are then formed. In one embodiment, the turns 316 are patterned from a main metal layer that is deposited over dielectric layer 314. Referring to FIG. 3F, a cross sectional view of one embodiment of a spiral inductor device 300 of the present invention is illustrated. In FIG. 3F, a protective dielectric layer 318 is formed overlaying the conductive turns 316 thereby forming one embodiment of an inducting device 400 of the present invention. As illustrated in FIG. 3F, the shield sections 304A and 304B are vertically positioned between the conductive turns 316 and the lossy substrate 302. Moreover, the ribs 312A and 312B are vertically positioned between the conductive turns 316 and the shield sections 304A and 304B.

In other embodiments of the present invention, the ribs 206 are formed from a layer directly overlaying a shield layer (not shown). An example of this embodiment is where the shield is formed from a polysilicon layer that overlays a working surface of a substrate. In this example, the ribs are composed of a metal silicide (silicide) at the surface of the polysilicon shield layer. Another example of this embodiment is where the shield layer is formed with a doped layer a semiconductor substrate and the ribs are formed from a silicide layer overlaying the working surface of the substrate.

In further other embodiments, the shield sections are formed from a silicide layer over a doped polysilicon layer and the ribs are formed from a metal layer. In yet another embodiment, the shield sections are formed from a metal silicide layer overlaying a doped layer in a substrate and the ribs are formed from a metal layer. In another embodiment, the shield sections are formed from a doped layer in a substrate and the ribs are formed from a doped polysilicon and metal silicide layer. In addition, in further embodiments, shield taps and ribs are formed from the same metal layer. In further yet another embodiment, shield taps are formed in a different metal layer than the ribs.

Figure 4:
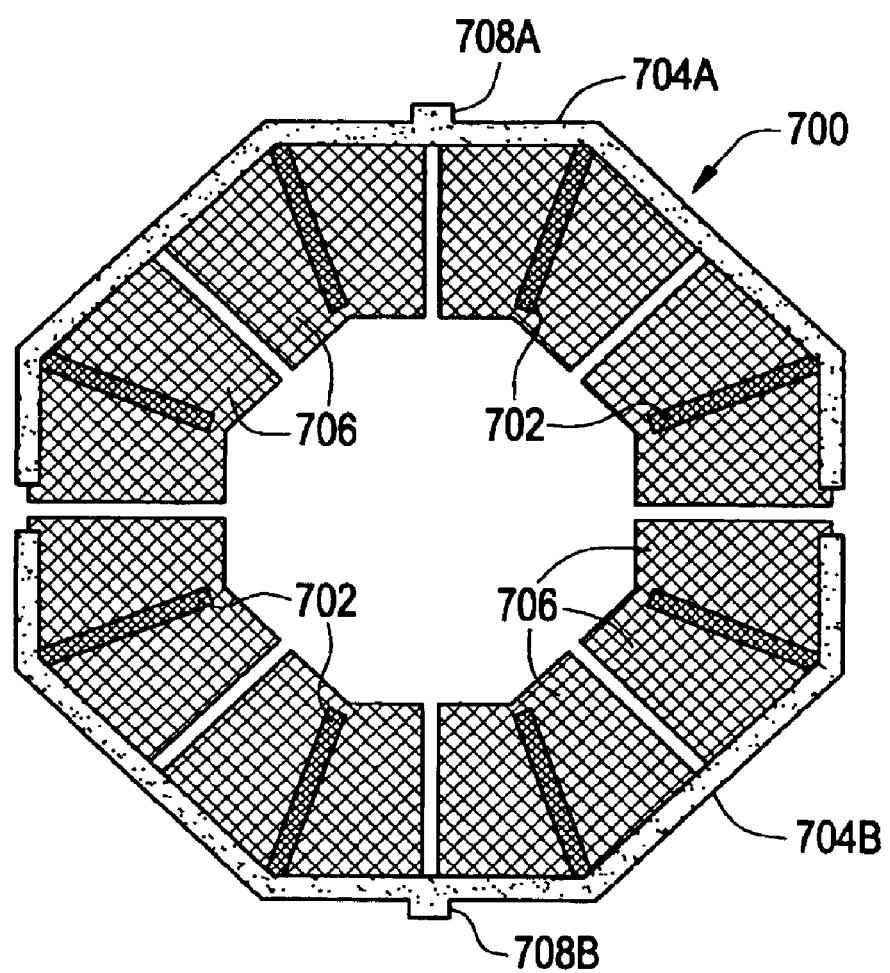
FIG. 4 is a plan view of an embodiment of a shield region for a spiral inductor of the present invention.
Figure 5:
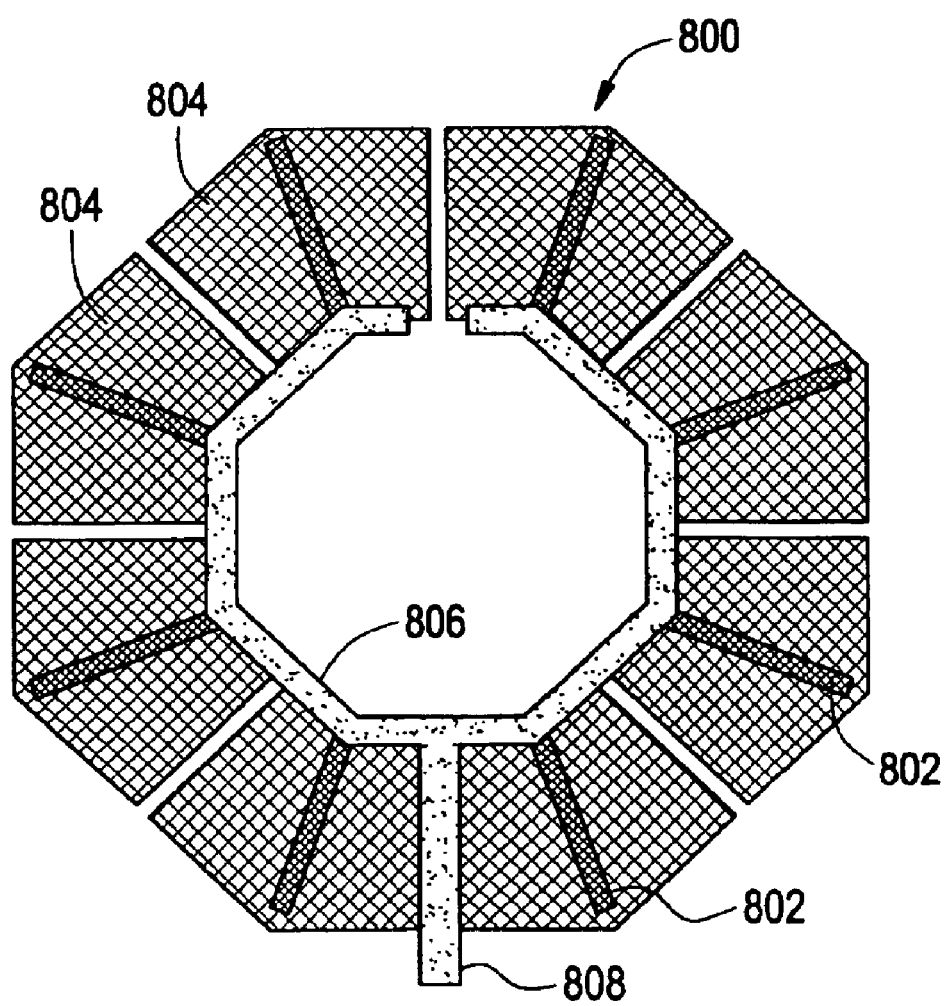
FIG. 5 is a plan view of another embodiment of a shield region for a spiral inductor of the present invention.

Referring to FIG. 4, a plan view of one embodiment of a shielding region 700 having ribs 702 of the present invention is illustrated. FIG. 4 does not illustrate conductive turns for clarity purposes. The conductive turns would extend over the shield sections 706. In this embodiment, two shield taps 704A and 704B are used. The shield taps 704A and 704A each have a shield tap terminal 708A and 708B respectfully. Respective shield sections 706 and ribs 702 are coupled to a respective shield tap 704A or 704B. Another example of a shielding region 800 having ribs 802 of one embodiment of the present invention is illustrated in the plan view of FIG. 5. In this embodiment, shield tap 806 is coupled to shield sections 804 and 802 at an interior location. In this embodiment, shield current is directed radially inward to the shield tap 806 and then out through shield tap terminal 808. The conductive turns are not illustrated in FIG. 5 for clarifying purposes. In another embodiment (not shown), the ribs extend inward beyond their associated shield sections in connecting to a shield tap. In further another embodiment (not shown), the ribs do not extend across the entire length of their associated shield sections.

Figure 6:
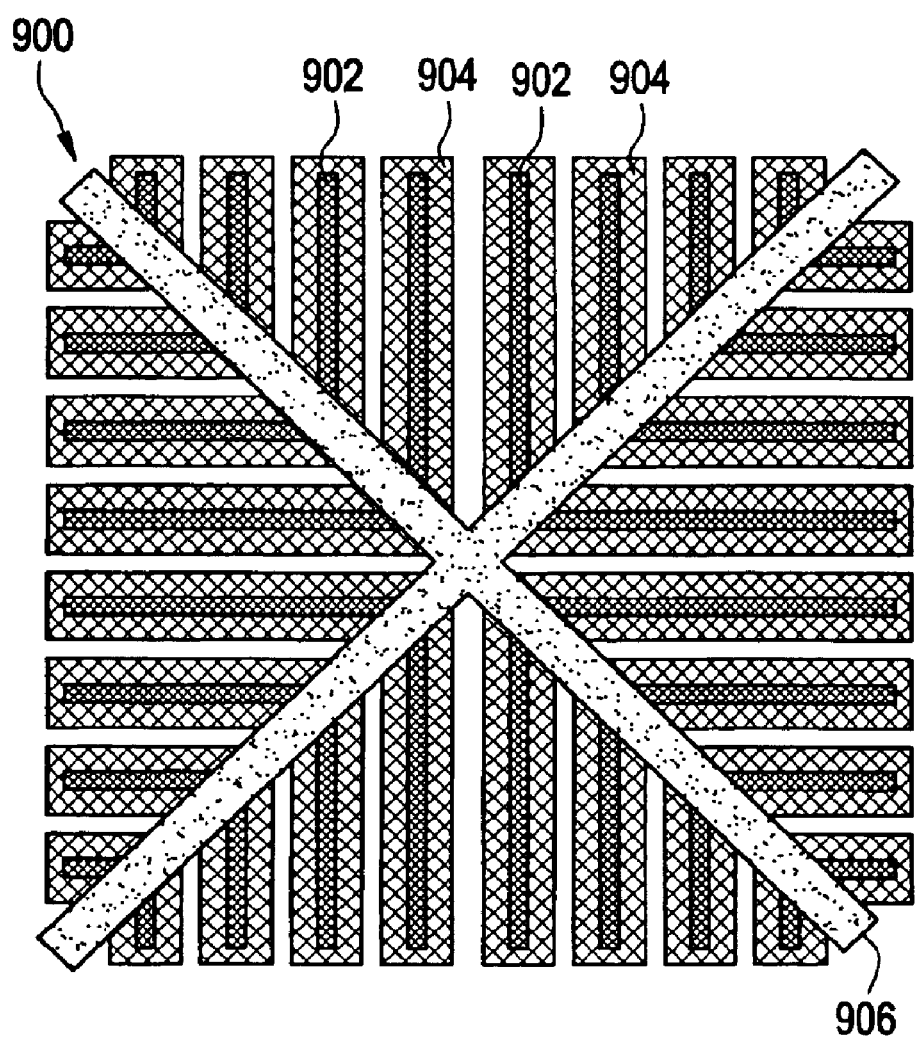
FIG. 6 is a plan view of further another embodiment of a shield region for a spiral inductor of the present invention.

Referring to FIG. 6, yet another embodiment of a shielding region 900 having ribs 902 is illustrated in the plan view of FIG. 6. As illustrated, in this embodiment, each rib 902 is coupled to an associated shield section 904. The shield tap 906 of this embodiment forms an X shape and is coupled to each rib 902 and each section of shield. Moreover, the conductive turns that form the inducting device 900 are not shown for illustration purposes.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming conductive ribs in an inductive device having patterned shield sections, the method comprising:

forming contacts to the patterned shield sections;

depositing a metal layer overlaying the contacts; and patterning the metal layer into ribs, wherein each rib is electrically coupled to an associated shield section via associated contacts.

2. The method of claim 1, wherein forming the contacts further comprise forming contact openings through a dielectric layer overlaying the shield sections; and depositing conductive material in the contact openings.

3. The method of claim 1, wherein each rib is patterned to have a relatively thin lateral width in relation to its associated shield section.

4. A method of forming conductive ribs in an inductive device having patterned shield sections, the method comprising:

siliciding a conductive layer overlaying the patterned shield sections; and patterning the silicided conductive layer into ribs, wherein each rib is patterned to have a lateral width that is relatively thin with respect to an associated shield segment, further wherein each rib is formed to be electrically coupled to its associated shield section.

5. The method of claim 4, further comprising:

electrically coupling each rib to an associated shield tap.

6. A method of forming an inducting device, the method comprising;

forming a conductive shield layer;

patterning the shield layer into shield sections;

forming a conductive rib layer, wherein the conductive rib layer is more conductive than the conductive shield layer, patterning the conductive rib layer into a plurality of ribs, wherein each rib is electrically coupled to an associated shield section; and forming conductive turns, wherein the ribs are positioned between the shield sections and the conductive turns.

7. The method of claim 6, further comprising:

forming a dielectric layer overlaying the shield sections;

forming contact openings through the dielectric layer in select locations;

forming conductive contacts in the contact openings, wherein each rib is electrically coupled to its associated shield section via associated conductive contacts.

8. The method claim 6, wherein the contacts and the ribs are formed at the same time.

9. The method of claim 6, wherein each rib is patterned to have a relatively thin lateral width in relation to its associated shield section.

10. The method of claim 6, wherein the conductive rib layer is formed from a conductive layer selected from a group consisting of one or more metal layers, a metal suicide overlaying a polysilicon surface, a metal suicide overlaying a substrate surface and a doped polysilicon and metal silicide.

11. The method of claim 6, wherein the conductive shield layer is formed from a conductive layer selected from a group consisting of, a polysilicon layer, a doped layer in a semiconductor substrate, a metal silicide layer over a doped polysilicon layer and a metal suicide layer.

12. The method of claim 6, further comprising:

forming one or more shield taps that are electrically coupled to each of the ribs.

13. The method of claim 12, wherein the at least one shield tap is formed from a conductive layer in which the ribs are formed.

* * * * *